US011177385B2

(12) United States Patent
Wang et al.

(10) Patent No.: US 11,177,385 B2
(45) Date of Patent: Nov. 16, 2021

(54) TRANSISTORS WITH A HYBRID SOURCE OR DRAIN (71) Applicant: GLOBALFOUNDRIES U.S. Inc., Santa Clara, CA (US)

(72) Inventors: Haiting Wang, Clifton Park, NY (US); Sipeng Gu, Clifton Park, NY (US); Jiehui Shu, Clifton Park, NY (US); Baofu Zhu, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/781,236

(22) Filed: Feb. 4, 2020

(65) Prior Publication Data

US 2021/0242344 A1 Aug. 5, 2021

(51) Int. Cl.
*H01L 29/78* (2006.01)
*H01L 29/08* (2006.01)
*H01L 29/66* (2006.01)

(52) U.S. Cl.
CPC ...... *H01L 29/7851* (2013.01); *H01L 29/0847* (2013.01); *H01L 29/6653* (2013.01); *H01L 29/6656* (2013.01); *H01L 29/66795* (2013.01)

(58) Field of Classification Search
CPC ....... H01L 21/82341; H01L 21/823821; H01L 27/0886; H01L 27/0924; H01L 27/11553; H01L 27/1158; H01L 29/0847; H01L 29/41766; H01L 29/41775; H01L 29/41783; H01L 29/41791; H01L 29/6636; H01L 29/6653; H01L 29/6656; H01L 29/66659; H01L 29/66795; H01L 29/7835; H01L 29/785; H01L 29/7851

See application file for complete search history.

(56) References Cited

U.S. PATENT DOCUMENTS

| 7,989,297 B2 * | 8/2011 | Yin | H01L 29/66628 438/300 |
| 10,164,036 B2 * | 12/2018 | Watanabe | H01L 29/785 |
| 10,249,755 B1 * | 4/2019 | Cheng | H01L 21/3086 |

(Continued)

OTHER PUBLICATIONS

Jiehui Shu et al., "Transistors With Separately-Formed Source and Drain" filed Aug. 15, 2019 as U.S. Appl. No. 16/541,600.

*Primary Examiner* — David C Spalla
(74) *Attorney, Agent, or Firm* — Thompson Hine LLP; Francois Pagette (57) ABSTRACT

Structures for a field-effect transistor and methods of forming a structure for a field-effect transistor. A gate structure extends over a channel region in a semiconductor body. The gate structure has a first side surface and a second side surface opposite the first side surface. A first source/drain region is positioned adjacent to the first side surface of the gate structure and a second source/drain region is positioned adjacent to the second side surface of the gate structure. The first source/drain region includes a first epitaxial semiconductor layer, and the second source/drain region includes a second epitaxial semiconductor layer. A first top surface of the first epitaxial semiconductor layer is positioned at a first distance from the channel region, a second top surface of the second epitaxial semiconductor layer is positioned at a second distance from the channel region, and the first distance is greater than the second distance.

13 Claims, 9 Drawing Sheets

(56) References Cited

U.S. PATENT DOCUMENTS

| | | |
|---|---|---|
| 2011/0049582 A1 | 3/2011 | Johnson et al. |
| 2012/0168832 A1* | 7/2012 | Anderson ............. H01L 29/665 257/288 |
| 2013/0049115 A1* | 2/2013 | Cheng ............... H01L 29/66477 257/347 |
| 2013/0277686 A1* | 10/2013 | Liu ................... H01L 29/66628 257/77 |
| 2019/0148492 A1 | 5/2019 | Yong et al. |
| 2020/0381548 A1* | 12/2020 | Lu ........................ H01L 29/785 |

* cited by examiner

TRANSISTORS WITH A HYBRID SOURCE OR DRAIN

BACKGROUND

The present invention relates to semiconductor device fabrication and integrated circuits and, more specifically, to structures for a field-effect transistor and methods of forming a structure for a field-effect transistor.

Complementary-metal-oxide-semiconductor (CMOS) processes may be employed to build a combination of p-type and n-type field-effect transistors that are used as devices to construct, for example, logic cells. Field-effect transistors generally include a source, a drain, a channel region between the source and drain, and a gate electrode overlapped with the channel region. When a control voltage exceeding a characteristic threshold voltage is applied to the gate electrode, carrier flow occurs in the channel region between the source and drain to produce a device output current.

The source and drain of a field-effect transistor are simultaneously formed. One approach is to implant ions containing a p-type dopant or an n-type dopant into regions of a semiconductor substrate to provide the source and drain. Another approach is to epitaxially grow sections of a semiconductor material from the semiconductor substrate to form the source and drain. The epitaxially-grown semiconductor material is in situ doped during growth with either a p-type dopant or an n-type dopant.

The operating characteristics of a field-effect transistor depend, among other factors, on the manner in which the source and drain are formed. Because of their simultaneous formation by either ion implantation or epitaxial growth, the properties of the source and drain cannot be individually engineered to optimize the operating characteristics of the field-effect transistor for certain design applications.

Improved structures for a field-effect transistor and methods of forming a structure for a field-effect transistor are needed.

SUMMARY

In an embodiment of the invention, a structure for a field-effect transistor is provided. The structure includes a semiconductor body having a channel region and a gate structure over the channel region. The gate structure has a first side surface and a second side surface opposite the first side surface. A first source/drain region is positioned adjacent to the first side surface of the gate structure and a second source/drain region is positioned adjacent to the second side surface of the gate structure. The first source/drain region includes a first epitaxial semiconductor layer, and the second source/drain region includes a second epitaxial semiconductor layer. A first top surface of the first epitaxial semiconductor layer is positioned at a first distance from the channel region, a second top surface of the second epitaxial semiconductor layer is positioned at a second distance from the channel region, and the first distance is greater than the second distance.

In an embodiment of the invention, a method of forming a structure for a field-effect transistor is provided. The method includes forming a gate structure over a semiconductor body, epitaxially growing a first semiconductor layer from a first portion of the semiconductor body adjacent to a first side surface of the gate structure to provide a first source/drain region, and epitaxially growing a second semiconductor layer from a second portion of the semiconductor body adjacent to a second side surface of the gate structure to provide a second source/drain region. A first top surface of the first semiconductor layer is positioned at a first distance from the channel region, a second top surface of the second semiconductor layer is positioned at a second distance from the channel region, and the first distance is greater than the second distance.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
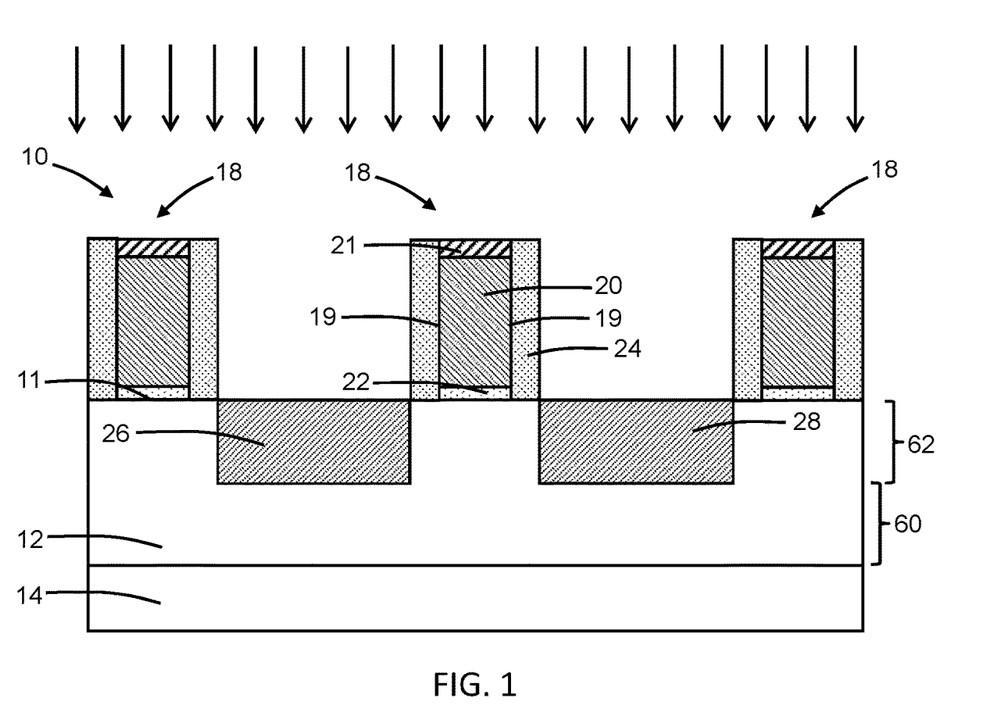
FIGS. 1-5 are cross-sectional views of a structure for a fin-type field-effect transistor at successive fabrication stages of a processing method in accordance with embodiments of the invention.
Figure 6:
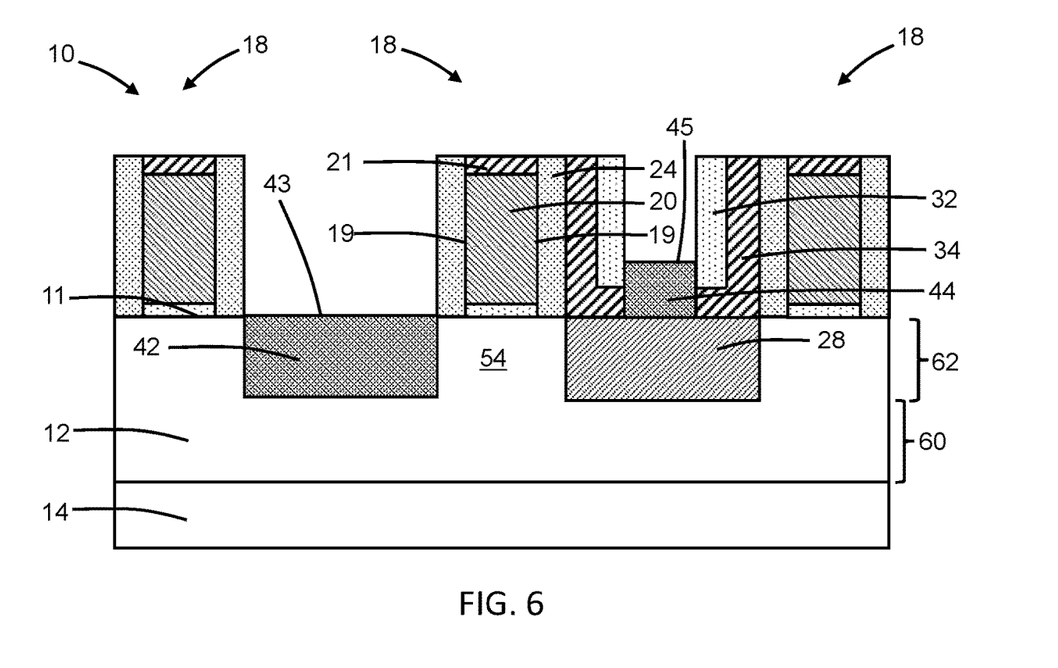
FIG. 6 is a cross-sectional view of the structure at a fabrication stage of the processing method subsequent to FIG. 5.

With reference to FIG. 1 and in accordance with embodiments of the invention, a structure 10 for a field-effect transistor includes a fin 12 that is arranged over, and projects upwardly away from, a substrate 14. The fin 12 and the substrate 14 may be composed of a single-crystal semiconductor material, such as single-crystal silicon. The fin 12 may be formed by patterning the substrate 14 with lithography and etching processes or by a self-aligned multi-patterning process. Shallow trench isolation 16 (FIGS. 6A, 6B) may surround a lower section 60 of the fin 12. An upper section 62 of the fin 12 is revealed above a top surface of the shallow trench isolation 16. The fin 12 defines a semiconductor body that may be used to form a field-effect transistor. The upper section 62 of the fin 12 includes a top surface 11 and sidewalls or side surfaces 13 (FIG. 6B).

Gate structures 18 extend laterally along respective longitudinal axes over and across the fin 12 and across the shallow trench isolation 16. Each gate structure 18 is aligned transverse to the fin 12 and overlaps with, and wraps about, the top surface 11 and side surfaces 13 of the upper section 62 of the fin 12. Each gate structure 18 may include a dummy gate 20 composed of a conductor, such as polycrystalline silicon (i.e., polysilicon), and a dielectric layer 22 composed of an electrical insulator, such as silicon dioxide. A gate cap 21 may be arranged over each gate structure 18.

Sidewall spacers 24 are arranged adjacent to the side surfaces or sidewalls 19 of each gate structure 18. The sidewall spacers 24 may be formed by depositing a conformal layer composed of a dielectric material, such as silicon nitride, and etching the deposited conformal layer with an anisotropic etching process, such as reactive ion etching.

Doped regions 26, 28 may be formed in the upper section 62 of the fin 12 and are arranged between the sidewall spacers 24 on the gate structures 18. The doped regions 26, 28 contain a concentration of an n-type or p-type dopant. The doped regions 26, 28 may be formed by an ion implantation process that introduces energetic ions, as indicated diagrammatically by the single-headed arrows, with ion trajectories that stop over a depth range in the fin 12. The ions may be generated from a suitable source gas and implanted into the fin 12 with given implantation conditions using an ion implantation tool. The implantation conditions (e.g., ion species, dose, kinetic energy, tilt angle) may be selected to tune the characteristics (e.g., depth profile) of the doped regions 26, 28. An implantation mask may be temporarily formed over other regions of the substrate 14 used to form different types of field-effect transistors.

In an embodiment, the doped regions 26, 28 may be concurrently formed in the fin 12 by implanting ions of a p-type dopant (e.g., boron) that provides p-type electrical conductivity. In an alternative embodiment, the doped regions 26, 28 may be concurrently formed in the fin 12 by implanting ions of an n-type dopant (e.g., phosphorus and/or arsenic) that provides n-type conductivity. In an embodiment, the dopant concentrations of the doped regions 26, 28 may be equal or substantially equal. The gate structures 18 and sidewall spacers 24 may function to self-align the ion-implantation process.

Figure 2:
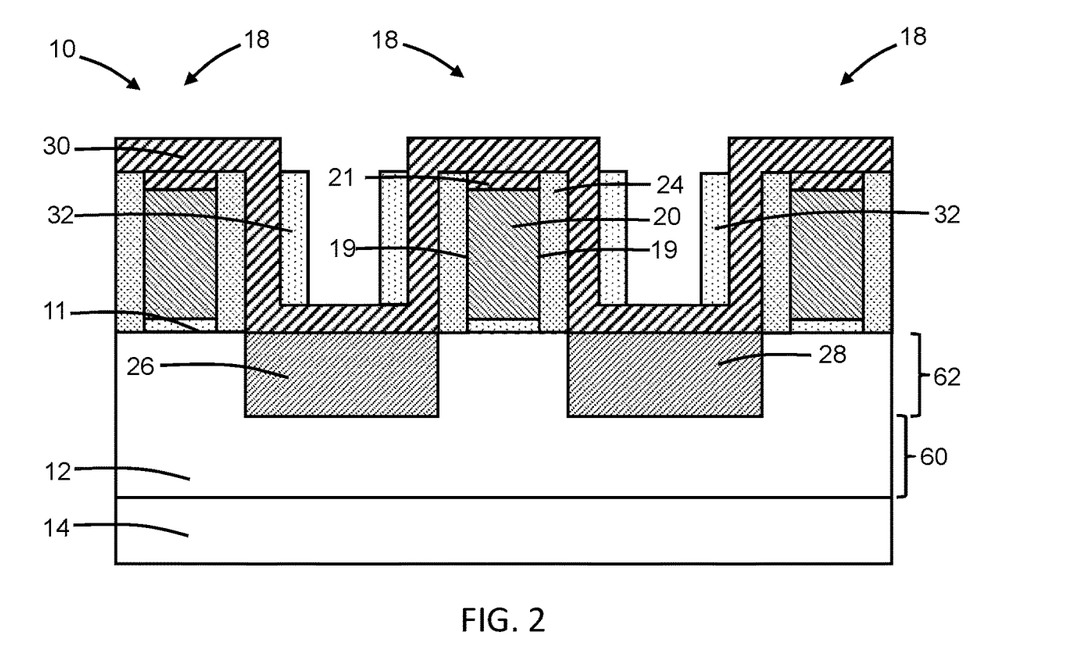

With reference to FIG. 2 in which like reference numerals refer to like features in FIG. 1 and at a subsequent fabrication stage, a conformal layer 30 composed of, for example, silicon nitride is deposited as a liner over the gate structures 18, sidewall spacers 24, and doped regions 26, 28 by, for example, atomic layer deposition. Sidewall spacers 32 are formed over portions of the conformal layer 30 by depositing a conformal layer composed of, for example, silicon dioxide, as a liner by, for example, atomic layer deposition and etching the deposited layer with an anisotropic etching process. The etching process may be a reactive ion etching process that etches the material constituting the sidewall spacers 32 selective to the materials of the conformal layer 30 and fin 12. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the material removal.

Figure 3:
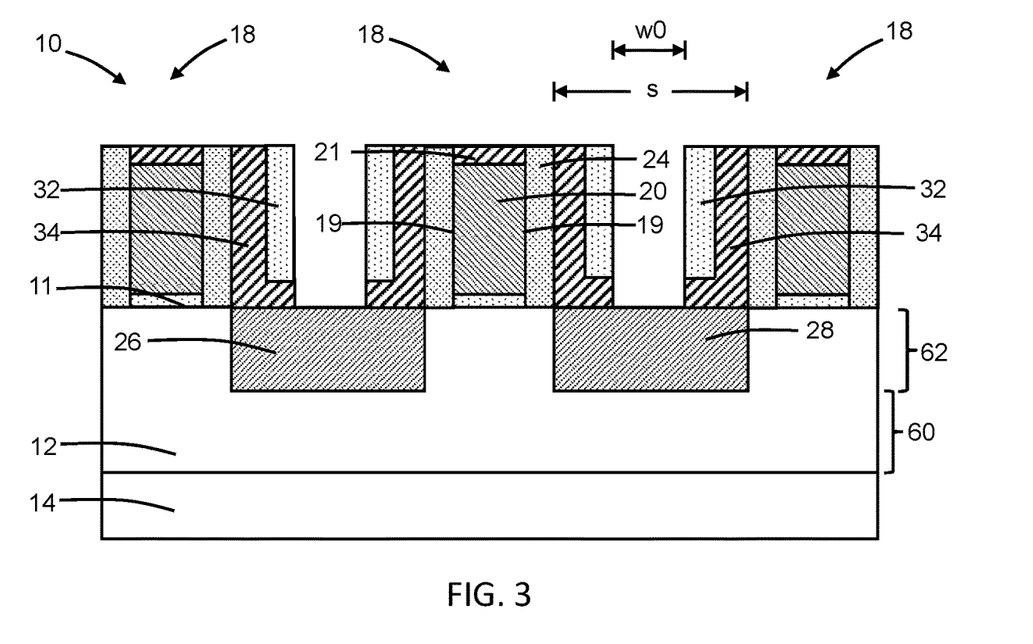

With reference to FIG. 3 in which like reference numerals refer to like features in FIG. 2 and at a subsequent fabrication stage, sidewall spacers 34 are formed by etching the conformal layer 30 with an anisotropic etching process, such as a reactive ion etching process. The sidewall spacers 32 mask portions of the conformal layer 30 during the etching process such that the sidewall spacers 34 are L-shaped. The conformal layer 30 is removed from a portion of the top surface 11 of the fin 12 over each of the doped regions 26, 28. The uncovered portion of each of the doped regions 26, 28 may be centrally located between an adjacent pair of the gate structures 18, and the uncovered portion of each of the doped regions 26, 28 has a width, w0, that is less than the spacing, s, between sidewall spacers 24 on adjacent gate structures 18. The sidewall spacers 32, 34 are sacrificial components that are subsequently removed from the structure 10 after epitaxial semiconductor layers are grown and that are not found in the completed structure 10.

Figure 4:
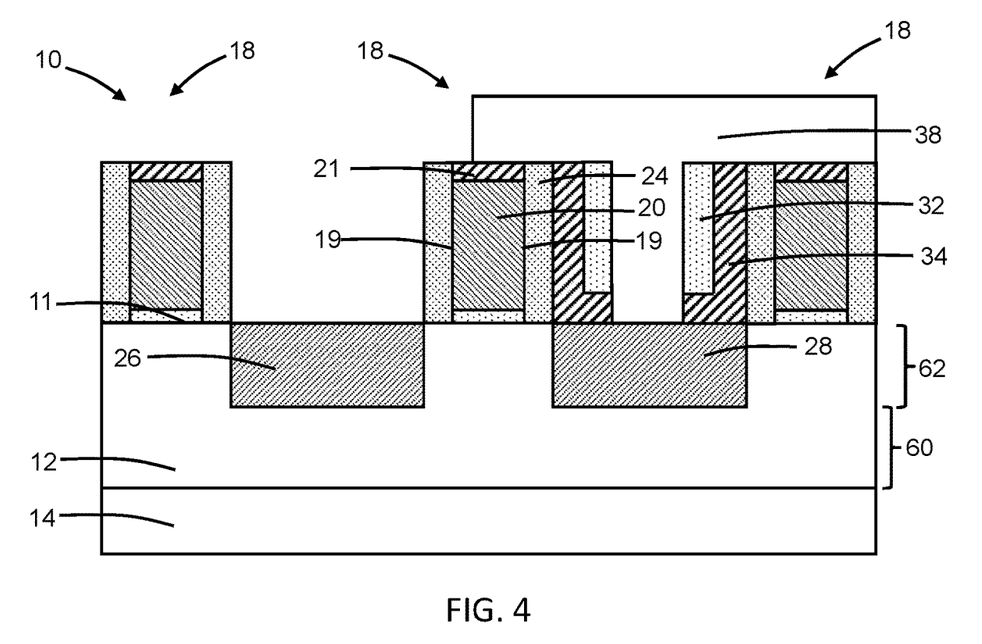

With reference to FIG. 4 in which like reference numerals refer to like features in FIG. 3 and at a subsequent fabrication stage, a block mask 38 is formed that covers the doped region 28 and that exposes the doped region 26. The block mask 38 may be a spin-on hardmask composed of an organic material that is patterned with lithography and etching processes to expose the doped region 26. The sidewall spacers 32, 34 are removed from over the exposed portion of the fin 12 that includes the doped region 26. The removal of the sidewall spacers 34, 36 exposes the entirety of the doped region 26, which has a width that is equal or substantially equal to the spacing between the sidewall spacers 24 on the gate structures 18 respectively adjacent to the doped region 26.

Figure 5:
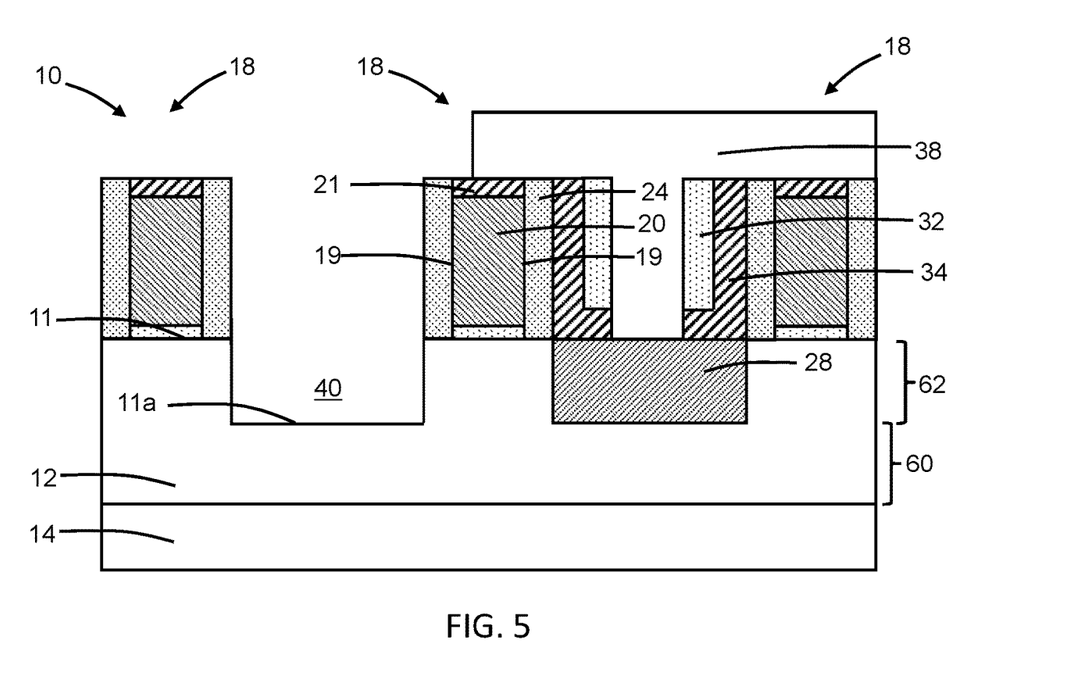

With reference to FIG. 5 in which like reference numerals refer to like features in FIG. 4 and at a subsequent fabrication stage, a cavity 40 is formed in the upper section 62 of the fin 12 by an etching process, such as an anisotropic etching process (e.g., reactive ion etching). The cavity 40 may remove a portion of the upper section 62 of the fin 12 and may fully remove the doped region 26. The fin 12 has a top surface 11a inside the cavity 40 that is recessed relative to the top surface 11 in other locations, such as the location of the doped region 28. The block mask 38 operates as an etch mask to protect the doped region 28 during the etching process forming the cavity 40. The block mask 38 may be stripped by, for example, an ashing process after the cavity 40 is formed.

Figure 6A:
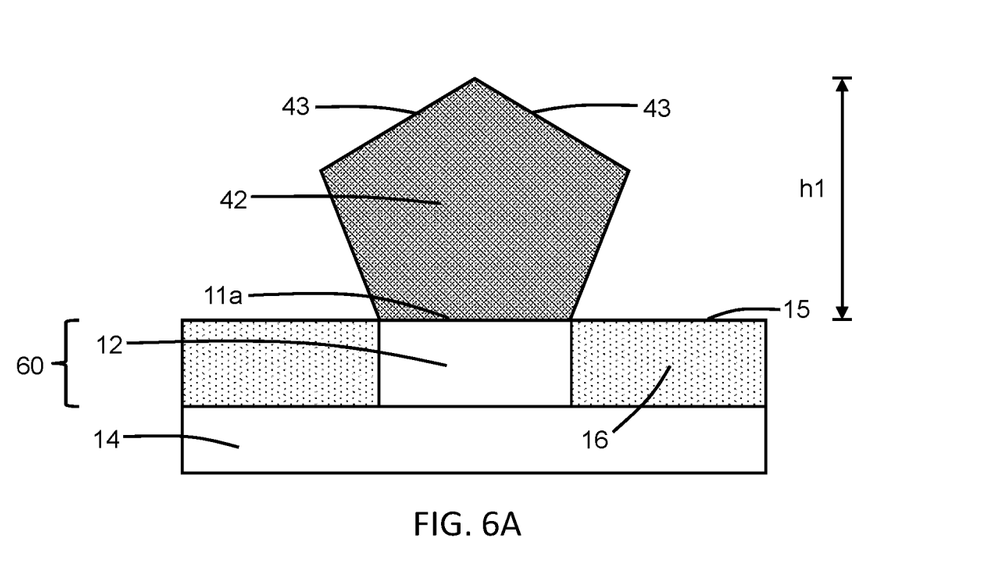
FIGS. 6A, 6B are cross-sectional views of different portions of the structure of FIG. 6 taken generally parallel to the longitudinal axes of the gate structures.
Figure 6B:
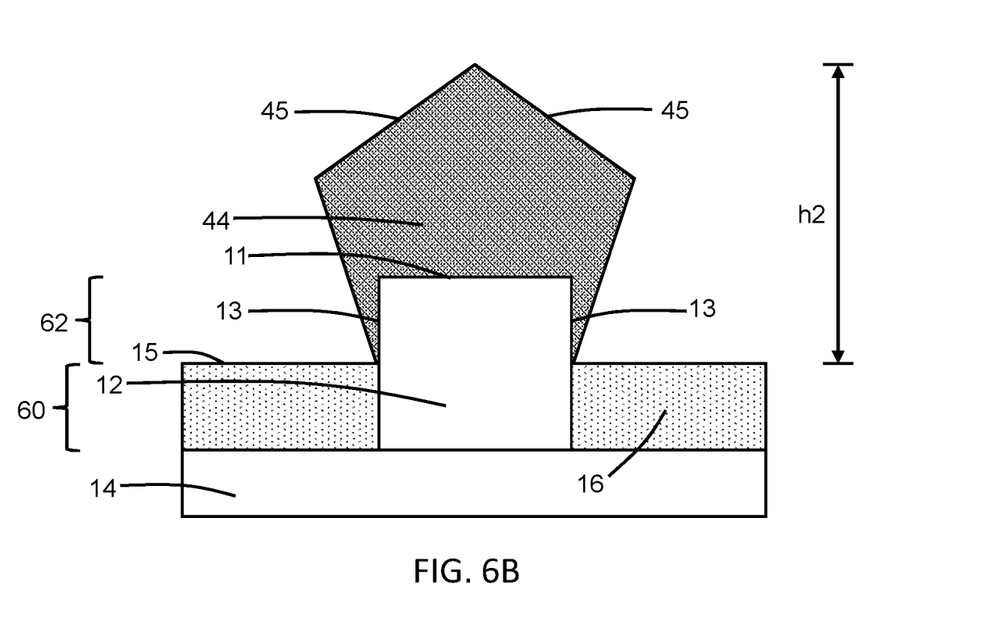

In an embodiment, the formation of the cavity 40 may fully remove the upper section 62 of the fin 12 arranged above the shallow trench isolation 16 (FIG. 6A, 6B). Only the lower section 60 of the fin 12, which is embedded in the shallow trench isolation 16, remains at the location of the cavity 40.

With reference to FIGS. 6, 6A, 6B in which like reference numerals refer to like features in FIG. 5 and at a subsequent fabrication stage, a layer 42 of an epitaxial semiconductor material is grown from the surfaces of the fin 12 bordering the cavity 40, and a layer 44 of an epitaxial semiconductor material is grown from the top surface 11 and side surfaces 13 (FIG. 6B) of the upper section 62 of the fin 12 bordering the doped region 28. The epitaxial semiconductor layer 42 may be in direct contact with the recessed top surface 11a of the fin 12. The epitaxial semiconductor layer 42 is prevented from growing from the side surfaces of the lower section 60 of the fin 12, which are embedded in the shallow trench isolation 16 after the local removal of the upper section 62 when the cavity 40 is formed.

As shown in FIG. 6B, the epitaxial semiconductor layer 44 may extend laterally from the space between the gate structures 18 and grows from the side surfaces 13 of the fin 12 to provide a cladding on the fin 12. The epitaxial semiconductor layer 44 clads the side surfaces 13 of the upper section 62 of the fin 12, which are located above the shallow trench isolation 16. The epitaxial semiconductor layer 44 is laterally spaced from the sidewall spacers 24 on the gate structures 18 by the sidewall spacers 32, 34.

The epitaxial growth process may be selective in that the semiconductor material does not grow from dielectric surfaces, such as the surfaces of the shallow trench isolation 16, the gate caps 21, the sidewall spacers 24, and the sidewall spacers 32, 34. The epitaxial semiconductor layers 42, 44 may be in situ doped during epitaxial growth with a concentration of a dopant. In an embodiment, the epitaxial semiconductor layers 42, 44 may be in situ doped during epitaxial growth with a p-type dopant (e.g., boron) that provides p-type conductivity. In an alternative embodiment, the epitaxial semiconductor layers 42, 44 may be in situ doped during epitaxial growth with an n-type dopant (e.g., phosphorus and/or arsenic) that provides n-type conductivity. In an embodiment, the epitaxial semiconductor layers 42, 44 may have the same conductivity type as the doped region 28. The epitaxial semiconductor layers 42, 44 may have a composition that contains germanium and silicon and, in an embodiment, the epitaxial semiconductor layers 42, 44 may be composed of silicon-germanium. In an embodiment, the epitaxial semiconductor layers 42, 44 may be composed of silicon-germanium and may contain a p-type dopant. In an alternative embodiment, the epitaxial semiconductor layers 42, 44 may be composed of silicon and may contain an n-type dopant.

The epitaxial semiconductor layer 44 is dimensionally smaller than the epitaxial semiconductor layer 42. The epitaxial semiconductor layer 42 is formed in the cavity 40 defined in the fin 12 but the epitaxial semiconductor layer 44 is not formed in a cavity defined in the fin 12. Instead, the epitaxial semiconductor layer 44 is formed by epitaxial growth from the exterior surfaces 11, 13 of the upper section 62 of the fin 12, which results in the epitaxial semiconductor layer 44 cladding the exterior surfaces 11, 13 of the fin 12. The epitaxial semiconductor layer 42 has a top surface 43 and epitaxial semiconductor layer 44 has a top surface 45 that is positioned above the top surface 43 of the epitaxial semiconductor layer 42. The epitaxial semiconductor layer 42 and the epitaxial semiconductor layer 44 may each have a faceted or diamond shape such that each of the top surfaces 43, 45 is inclined and converges at an apex between inclined or angled portions. The top surface 43 of the epitaxial semiconductor layer 42 at the apex may be located at a height or distance, h1, relative to a channel region 54, and the top surface 45 of the epitaxial semiconductor layer 44 at the apex may be located at a height or distance, h2, relative to the channel region 54 that is greater than the distance, h1. The heights h1, h2 may also be measured relative to the top surface 15 of the shallow trench isolation 16, or relative to a different reference plane that is located below the top surfaces 43, 45. In an embodiment, the entirety of the top surface 45 of the epitaxial semiconductor layer 44 may be taller than the entirety of the top surface 43 of the epitaxial semiconductor layer 42.

A lower portion of the epitaxial semiconductor layer 44 provides a cladding layer on the top surface 11 and side surfaces 13 of the upper section 62 of the fin 12. The cladding effect is absent for epitaxial semiconductor layer 42, which is epitaxially grown from the surfaces of the fin 12 bordering the cavity 40 and is not epitaxially grown from the side surfaces 13 of the upper section 62 of the fin 12, which is removed by cavity formation.

Figure 7:
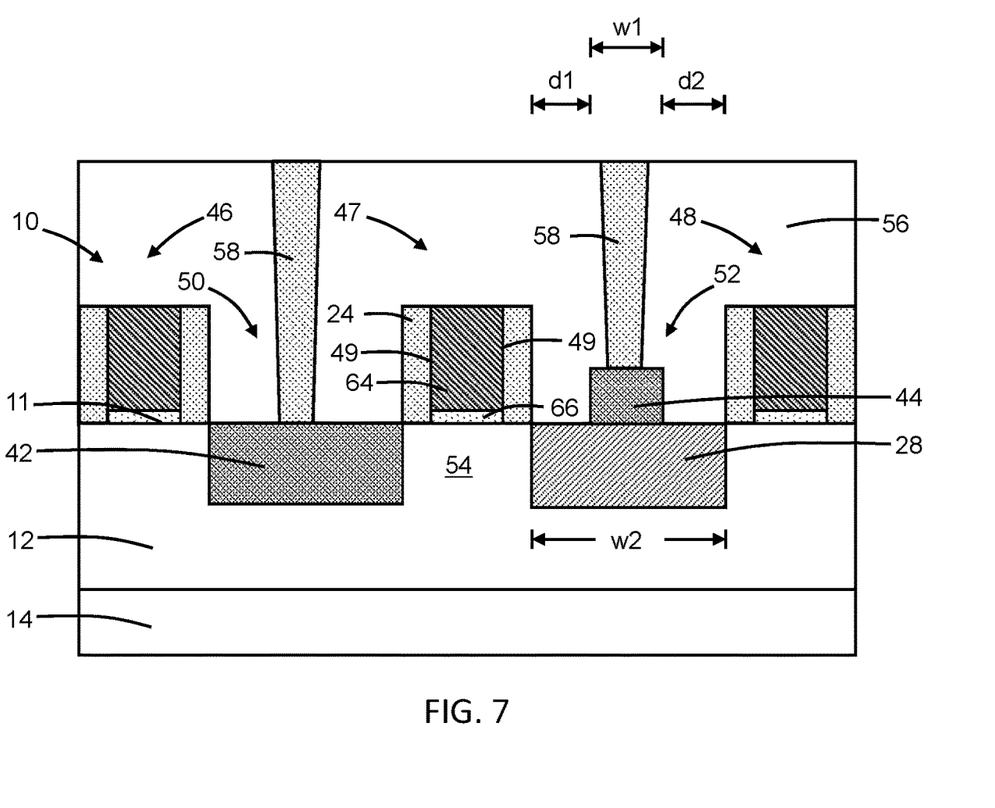
FIG. 7 is a cross-sectional view of the structure at a fabrication stage of the processing method subsequent to FIG. 6.

With reference to FIG. 7 in which like reference numerals refer to like features in FIG. 6 and at a subsequent fabrication stage, a replacement gate process is performed to replace the gate structures 18 with gate structures 46, 47, 48 and complete the structure 10 for the field-effect transistor. The gate structures 46, 47, 48 may include an electrode layer 64 composed of one or more metal gate materials, such as work function metals, and a gate dielectric layer 66 composed of a dielectric material, such as a high-k dielectric material like hafnium oxide.

The structure 10 includes a source/drain region 50 provided by the embedded epitaxial semiconductor layer 42, and a hybrid source/drain region 52 provided by the non-embedded epitaxial semiconductor layer 44 and the underlying doped region 28. As used herein, the term "source/drain region" means a doped region of semiconductor material that can function as either a source or a drain of a field-effect transistor. In an embodiment, the source/drain region 50 may provide a source in the structure 10, and the hybrid source/drain region 52 may provide a drain in the structure 10. In an alternative embodiment, the source/drain region 50 may provide a drain in the structure 10, and the hybrid source/drain region 52 may provide a source in the structure 10. The source/drain regions 50, 52 are doped to have a conductivity type of the same polarity. The fin 12 provides a semiconductor body used to form the source/drain regions 50, 52, which have an asymmetrical arrangement due to the different manner in which each is formed.

The channel region 54 is disposed in a portion of the fin 12 between the source/drain region 50 and the hybrid source/drain region 52 and beneath an overlying gate structure 47. The channel region 54 extends from the top surface 11 of the fin 12 into the fin 12 to a given depth. The epitaxial semiconductor layer 44 of the hybrid source/drain region 52 is laterally spaced from the sidewall spacers 24 on the adjacent sidewalls 49 of the gate structures 47, 48 by respective distances d1 and d2. In an embodiment, the distances d1 and d2 may be equal or substantially equal. The doped region 28 may extend fully between the sidewall spacers 24 on the adjacent sidewalls 49 of the gate structures 47, 48, and the doped region 28 has a width, w1, that is greater than the width, w2, of the epitaxial semiconductor layer 44. The epitaxial semiconductor layer 42 of source/drain region 50 may also extend fully between the sidewall spacers 24 on the adjacent sidewalls 49 of the gate structures 46, 47.

Middle-of-line processing and back-end-of-line processing follow, which includes formation of contacts, vias, and wiring for an interconnect structure that is coupled with the field-effect transistor. Contacts 56, which are located in an interlayer dielectric layer 58 of the interconnect structure, are coupled with the source/drain regions 50, 52.

In operation, the hybrid source/drain region 52 of the field-effect transistor may exhibit a reduced leakage on the drain side in combination with a low contact resistance. The epitaxial semiconductor layer 44 contributing to the hybrid source/drain region 52 is smaller and taller than the epitaxial semiconductor layer 42 contributing to the source/drain region 50.

Figure 8:
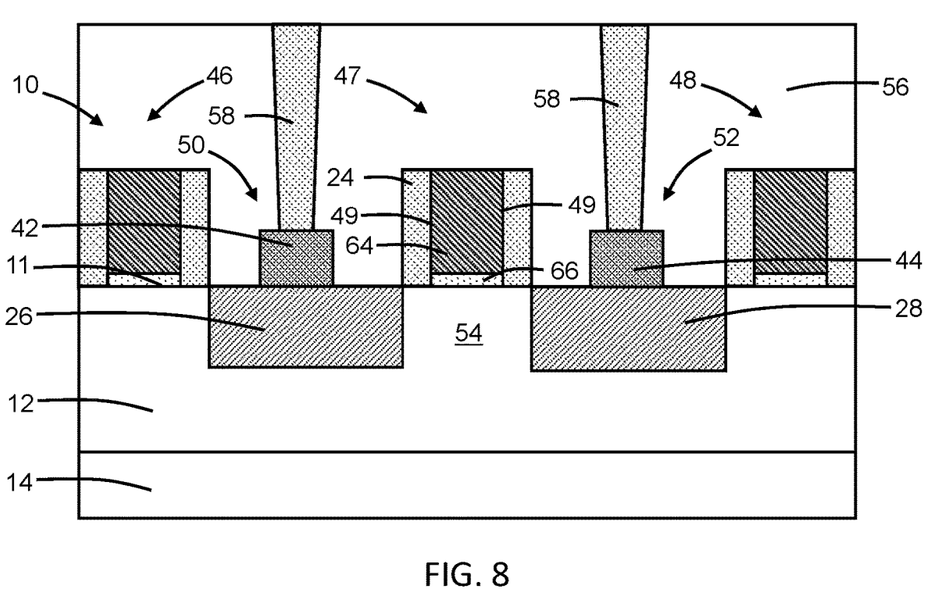
FIG. 8 is a cross-sectional view of a structure in accordance with alternative embodiments of the invention.

With reference to FIG. 8 in which like reference numerals refer to like features in FIG. 7 and in accordance with embodiments of the invention, the doped region 26 may be retained, the cavity 40 may be omitted, and the epitaxial semiconductor layer 42 may formed in a manner similar to the epitaxial semiconductor layer 44. The source/drain region 50 includes the doped region 26 in the fin 12 and the epitaxial semiconductor material of epitaxial semiconductor layer 42 formed as a cladding on the fin 12. The hybrid source/drain region 52 includes the doped region 28 in the fin 12 and the epitaxial semiconductor material of epitaxial semiconductor layer 44 formed as a cladding on the top surface 11 and side surfaces 13 of the upper section 62 of the fin 12.

Example

Different device structures for a fin-type field-effect transistor were assessed by computer simulation using Technology Computer-Aided Design (TCAD) tools to model the electrical characteristics of the different device structures. The modeled device structures were identical with the exception of the source and drain regions. The modeled device structures had total device length of 260 nm including a gate length of 150 nm, a source contact length of 35 nm, and a drain contact length of 35 nm. Values of electrical characteristics determined by the TCAD computer simulation for the different device structures are summarized in the Table.

For one of the modeled device structures (i.e., Epitaxial S/D regions), both of the source/drain regions were formed from epitaxial semiconductor material containing boron as a p-type dopant. For another of the modeled device structures (i.e., Asymmetrical device), the source was formed from epitaxial semiconductor material containing boron as a p-type dopant, and the drain was formed by a boron-doped implanted region. For another of the modeled device structures (i.e., Asymmetrical device with hybrid drain), the source region was formed by boron-doped implanted region, and the drain was formed from the combination of the smaller-size layer of epitaxial semiconductor material containing boron as a p-type dopant and a boron-implanted region beneath the smaller-size layer of epitaxial semiconductor material.

TABLE

| | Idlin μA/um | Idsat μA/um | Rodlin ohm · μm | Idoff nA/Fin | Isoff nA/Fin |
|---|---|---|---|---|---|
| Epitaxial S/D regions | 57 | 757 | 2525 | 1.027 | 0.007 |
| Asymmetrical device | 33 | 622 | 3581 | 0.016 | 0.002 |
| Asymmetrical device with hybrid drain | 44 | 669 | 3201 | 0.030 | 0.003 |

As apparent in the Table, the value of the drain current when the field-effect transistor is biased in the linear region (Idlin) for the asymmetrical device with hybrid drain is between the value of Idlin for the device with epitaxial source/drain regions and the value of Idlin for the asymmetrical device. Similarly, the value of the drain current when the transistor is biased in the saturation region (Idsat) for the asymmetrical device with hybrid drain is between the value of Idsat for the device with epitaxial source/drain regions and the value of Idsat for the asymmetrical device. The value of the contact resistance (Rodlin) for the asymmetrical device with hybrid drain is between the value of Rodlin for the device with epitaxial source/drain regions and the value of Rodlin for the asymmetrical device.

As also apparent in the Table, the value of the drain leakage current when the transistor is in the off state (Idoff) for the asymmetrical device with hybrid drain is comparable to the value of Idoff for the asymmetrical device and is significantly less than the value of Idoff for the device with epitaxial source/drain regions. The value of the source leakage current when the transistor is in the off state (Isoff) of the asymmetrical device with hybrid drain is between the value of Isoff for the asymmetrical device and the value of Isoff for the device with epitaxial source/drain regions.

The reduction of the drain leakage current for the asymmetrical device with hybrid drain, when the transistor is in the off state, may be achieved without a significant sacrifice of device performance.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
   a semiconductor fin including a cavity, a first top surface outside of the cavity, and a second top surface inside the cavity that is recessed relative to the first top surface;
   a first gate structure that extends over the semiconductor fin, the first gate structure having a first side surface and a second side surface opposite the first side surface;
   a second gate structure that extends over the semiconductor fin, the second gate structure having a side surface adjacent to the first side surface of the first gate structure;
   a first sidewall spacer on the first side surface of the first gate structure;
   a second sidewall spacer on the side surface of the second gate structure;
   a drain region adjacent to the first side surface of the first gate structure, the drain region including a first doped region in a first portion of the semiconductor fin and a first epitaxial semiconductor layer on the first top surface of the semiconductor fin over the first doped region, the first epitaxial semiconductor layer laterally positioned between the first sidewall spacer and the second sidewall spacer, the first epitaxial semiconductor layer laterally spaced from the first sidewall spacer by a first distance, and the first epitaxial semiconductor layer laterally spaced from the second sidewall spacer by a second distance; and a source region adjacent to the second side surface of the first gate structure, the source region including a second epitaxial semiconductor layer on the second top surface inside the cavity in the semiconductor fin.

2. The structure of claim 1 wherein the semiconductor fin includes an upper section having a first side surface and a second side surface, the first top surface is arranged between the first side surface and the second side surface, and the first epitaxial semiconductor layer is further arranged on the first side surface and the second side surface of the upper section of the semiconductor fin.

3. The structure of claim 2 wherein the semiconductor fin includes a lower section, and the first epitaxial semiconductor layer is located over the lower section of the semiconductor fin.

4. The structure of claim 3 further comprising:
a shallow trench isolation surrounding the lower section of the semiconductor fin.

5. The structure of claim 1 wherein the first distance is equal to the second distance.

6. The structure of claim 4 wherein the shallow trench isolation has a top surface, and the first epitaxial semiconductor layer is fully positioned above the top surface of the shallow trench isolation.

7. A method of forming a structure for a field-effect transistor, the method comprising:
forming a first gate structure that extends over a semiconductor fin, wherein the first gate structure has a first side surface and a second side surface opposite the first side surface;
forming a second gate structure that extends over the semiconductor fin, wherein the second gate structure has a side surface adjacent to the first side surface of the first gate structure;
forming a first sidewall spacer on the first side surface of the first gate structure;
forming a second sidewall spacer on the side surface of the second gate structure;
ion implanting a first portion of the semiconductor fin adjacent to the first side surface of the first gate structure with an ion implantation process to form a first doped region;

epitaxially growing a first semiconductor layer on a first top surface of the first portion of the semiconductor fin to provide a drain region that includes the first semiconductor layer and the first doped region, wherein the first semiconductor layer is laterally positioned between the first sidewall spacer and the second sidewall spacer, the first semiconductor layer is laterally spaced from the first sidewall spacer by a first distance, and the first semiconductor layer is laterally spaced from the second sidewall spacer by a second distance; and epitaxially growing a second semiconductor layer on a second top surface inside a cavity in the semiconductor fin adjacent to the second side surface of the first gate structure to provide a source region, wherein the first top surface is outside of the cavity, and the second top surface inside the cavity is recessed relative to the first top surface.

8. The method of claim 7 wherein the semiconductor fin includes an upper section having a first side surface and a second side surface, the first top surface is arranged between the first side surface and the second side surface, and the first semiconductor layer is further arranged on the first side surface and the second side surface of the upper section of the semiconductor fin.

9. The method of claim 7 further comprising:
forming a shallow trench isolation surrounding a lower section of the semiconductor fin,
wherein the second semiconductor layer is positioned on the lower section of the semiconductor fin.

10. The method of claim 7 wherein the first semiconductor layer is epitaxially grown in a space over the first portion of the semiconductor fin between a first sacrificial sidewall spacer and a second sacrificial sidewall spacer, and further comprising:
removing the first sacrificial sidewall spacer and the second sacrificial sidewall spacer after the first semiconductor layer is epitaxially grown.

11. The method of claim 7 wherein the first distance is equal to the second distance.

12. The method of claim 9 wherein the first semiconductor layer is fully positioned above a top surface of the shallow trench isolation.

13. The method of claim 10 further comprising:
forming a third sacrificial sidewall spacer on the second side surface of the first gate structure and a fourth sacrificial sidewall spacer on the side surface of the second gate structure; and
before epitaxially growing the second semiconductor layer, removing the third sacrificial sidewall spacer and the fourth sacrificial sidewall spacer.

* * * * *